US009629282B2

(12) United States Patent
Kasahara et al.

(10) Patent No.: US 9,629,282 B2
(45) Date of Patent: Apr. 18, 2017

(54) ELECTRONIC DEVICE, STRUCTURE, AND HEAT SINK

(75) Inventors: Yoshiaki Kasahara, Tokyo (JP); Hiroshi Toyao, Tokyo (JP)

(73) Assignee: NEC Corporation, Tokyo (JP)

( * ) Notice: Subject to any disclaimer, the term of this patent is extended or adjusted under 35 U.S.C. 154(b) by 126 days.

(21) Appl. No.: 14/124,664

(22) PCT Filed: Apr. 11, 2012

(86) PCT No.: PCT/JP2012/002516
§ 371 (c)(1),
(2), (4) Date: Dec. 6, 2013

(87) PCT Pub. No.: WO2012/169104
PCT Pub. Date: Dec. 13, 2012

(65) Prior Publication Data
US 2014/0098499 A1    Apr. 10, 2014

(30) Foreign Application Priority Data

Jun. 10, 2011    (JP) .................................. 2011-130358

(51) Int. Cl.
| H05K 7/20 | (2006.01) |
| H01P 1/20 | (2006.01) |
| H01L 23/36 | (2006.01) |
| H01L 23/552 | (2006.01) |
| H05K 1/02 | (2006.01) |
| H01L 23/367 | (2006.01) |
| H01L 23/64 | (2006.01) |

(52) U.S. Cl.
CPC ........... H05K 7/2039 (2013.01); H01L 23/36 (2013.01); H01L 23/3677 (2013.01);
(Continued)

(58) Field of Classification Search
CPC .... H05K 1/021; H05K 1/0227; H05K 1/0236; H01L 23/66; H01L 23/552
(Continued)

(56) References Cited

U.S. PATENT DOCUMENTS 5,500,556 A * 3/1996 Kosugi ................ H01L 23/433
257/718
7,848,108 B1    12/2010 Archambeault et al.
(Continued)

FOREIGN PATENT DOCUMENTS

CN    101996963 A    3/2011
JP    2007221064 A    8/2007
(Continued)

OTHER PUBLICATIONS

International Search Report Corresponding to PCT/JP2012/002516, dated Jul. 24, 2012, 2 pages.

Primary Examiner — Tuan T Dinh
Assistant Examiner — Mukund G Patel
(74) Attorney, Agent, or Firm — Wilmer Cutler Pickering Hale and Dorr LP

(57) ABSTRACT

An electronic device includes a substrate (101), a conductor plane (104) which is provided on an inner layer of the substrate (101), an electronic circuit (102) which is mounted on the substrate (101), a heat sink (103) which is mounted on an upper surface of the electronic circuit (102), includes a portion which does not overlap with the electronic circuit (102) when seen in a plan view, faces the conductor plane (104), and is configured of a conductive material, a conductor via (105) which is connected to the heat sink (103) on a surface of the heat sink (103) contacting the electronic circuit (102), and extends toward the conductor plane (104), and a stub (106) which is connected to the conductor via (105) and extends to face the conductor plane (104).

13 Claims, 25 Drawing Sheets

(52) U.S. Cl.
CPC .......... *H01L 23/552* (2013.01); *H01P 1/2005* (2013.01); *H05K 1/0236* (2013.01); *H01L 23/3672* (2013.01); *H01L 23/64* (2013.01); *H01L 2924/0002* (2013.01); *H05K 1/0203* (2013.01)

(58) Field of Classification Search
USPC ....... 361/679.54, 70–719; 257/728; 174/16.3
See application file for complete search history.

(56) References Cited

U.S. PATENT DOCUMENTS

| | | | | |
|---|---|---|---|---|
| 2009/0279265 | A1* | 11/2009 | Imazato | ................ H01L 23/367 |
| | | | | 361/710 |
| 2009/0315648 | A1* | 12/2009 | Toyao | ................... H01P 1/2005 |
| | | | | 333/238 |
| 2010/0011326 | A1* | 1/2010 | Sadamatsu | .......... G06F 17/5068 |
| | | | | 716/125 |

FOREIGN PATENT DOCUMENTS

| | | |
|---|---|---|
| JP | 2007258385 A | 10/2007 |
| JP | 2009100168 A | 5/2009 |
| JP | 2009283768 A | 12/2009 |
| JP | 2011040742 A | 2/2011 |
| JP | 2011124503 A | 6/2011 |
| KR | 20110014956 A | 2/2011 |
| TW | 201112938 A | 4/2011 |
| WO | WO-2011070736 A1 | 6/2011 |

\* cited by examiner

LINE ⟷ IS LESS THAN λ/2

CITED DRAWING OF PATENT DOCUMENT 1

CITED DRAWING OF PATENT DOCUMENT 2

ELECTRONIC DEVICE, STRUCTURE, AND HEAT SINK

CROSS-REFERENCE TO RELATED APPLICATIONS

This application is a national stage application of International Application No. PCT/JP2012/002516 entitled "ELECTRONIC DEVICE, STRUCTURE, AND HEAT SINK," filed on Apr. 11, 2012, which claims the benefit of the priority of Japanese patent application JP2011-130358, filed on Jun. 10, 2011, the disclosures of each of which are hereby incorporated by reference in their entirety.

TECHNICAL FIELD

The present invention relates to an electronic device, a structure, and a heat sink.

BACKGROUND ART

In an electronic circuit such as an IC or an LSI which is mounted on a substrate, high integration is advanced to realize high speed and high function, and accordingly, a large electric current is consumed. According to heat generation of the large electric current, a heat sink is always provided on the electronic circuit to prevent the electronic circuit from exceeding an allowable temperature. For example, the heat sink is configured of a metal, effectively radiates the heat generated by the electronic circuit to the atmosphere, and thus, suppresses an increase in the temperature of the electronic circuit.

When the heat sink is provided, high frequency components of electromagnetic waves generated by the electronic circuit combine with the heat sink, and when the heat sink is a resonant state, there is a problem that significantly strong electromagnetic radiation noise (hereinafter, referred to as "radiation noise") is radiated to the atmosphere. Since the radiation noise decreases radio performance of a device, a unit which suppresses the radiation noise is required.

In order to solve the problem of the radiation noise, there is a method which inserts an electromagnetic wave absorbing material between the electronic circuit and the heat sink. However, in order to obtain sufficient electromagnetic wave absorbing effects by the electromagnetic wave absorbing material of the related art, the electromagnetic wave absorbing material should have a thickness in a certain extent. Accordingly, a decrease in a thermal contact between the electronic circuit and the heat sink is generated, and thus, there is a problem that the electronic circuit cannot be sufficiently cooled.

In Patent Document 1, an electromagnetic wave absorbing material which alleviates the influences of the above-described problems is described. As shown in FIG. 24, an electromagnetic wave absorbing material 1 is formed of a sheet shape, and has a structure in which a first layer 11 formed of a composite magnetic material having high relative permeability and a second layer 12 formed of a composite dielectric material having high relative permittivity are laminated to each other.

In Patent Document 1, it is described that electromagnetic wave countermeasure effects are sufficiently obtained by the electromagnetic wave absorbing material 1 even though the sheet is thinned. Moreover, it is described that a decrease in the thermal contact can be suppressed since the sheet can be thinned. Furthermore, it is described that adjustment of absorption frequency of the electromagnetic wave is performed by a relative permeability control according to adjustment of a compounding ratio of magnetic materials configuring the composite magnetic material and a relative permittivity control according to adjustment of a compounding ratio of dielectric materials configuring the composite dielectric material.

In Patent Document 2, another method for solving the problems of the radiation noise is described. That is, as shown in FIG. 25, a heat sink device is obtained in which an inner layer pattern 121, a fitting pattern 13, amounting stud 14, and a heat sink 3 can be the same potential by connecting the inner layer pattern 121 and the heat sink 3 having a common potential to each other, and radiation noise can be attenuated by electrostatic shield (shielding) effects. Furthermore, the heat sink device is obtained which realizes space saving by making a pad diameter of the fitting pattern 13 and a diameter of the mounting stud 14 be approximately the same as each other and is suitable for a high density mounting.

RELATED DOCUMENT

Patent Document

[Patent Document 1] Japanese Unexamined Patent Publication No. 2007-221064
[Patent Document 2] Japanese Unexamined Patent Publication No. 2007-258385

DISCLOSURE OF THE INVENTION

However, in the technologies of Patent Documents 1 and 2, the following problems exist.

First, problems of the technology of Patent Document 1 will be described. A first problem is that in a case of the technology of Patent Document 1 in which the electromagnetic wave absorbing material is inserted between the heat sink and the electronic circuit, the problem in that the electromagnetic wave absorbing material causes the decrease of the thermal contact between the heat sink and the electronic circuit is not essentially solved. That is, even though the decrease of the thermal contact can be suppressed by decreasing the thickness of the electromagnetic wave absorbing material, since the electromagnetic wave absorbing material exists between the heat sink and the electronic circuit, the decrease of the thermal contact due to the electromagnetic wave absorbing material still remains.

A second problem is that frequency having an electromagnetic wave suppression effect cannot be freely controlled. In the electromagnetic wave absorption sheet described in Patent Document 1, as described above, the control of the applied frequency is possible by controlling the compounding ratio of the magnetic materials and the compounding ratio of the dielectric materials in which the materials configure each layer. However, the compounding ratio of the magnetic materials and the compounding ratio of the dielectric materials are restricted by an object of obtaining sufficient flexibility and electromagnetic wave attenuation effect. Accordingly, it is considered that the frequency which is actually available is approximately 700 MHz to 900 MHz, and for example, the frequency cannot correspond to a high frequency band such as a GHz band which is used in wireless communication in recent years.

Next, problems of the technology of Patent Document 2 will be described. In Patent Document 2, it is described that space saving can be realized. However, since the fitting pattern 13 in which the mounting stud 14 has a through-hole to the inner layer is required, amounting space to the inner layer of a multilayer print substrate 11 is required. Generally, since a layer in which interconnects are disposed in high density exists on a signal layer of the inner layer of the substrate, the above-described configuration is not preferable.

The present invention relates to an electronic device which includes a substrate and a heat sink, and an object thereof is to provide an electronic device which can suppress radiation noise of arbitrary frequency without generating a decrease of a thermal contact between the heat sink and an electronic circuit.

According to the present invention, there is provided an electronic device including: a substrate; a conductor plane which is provided on an inner layer or a surface of the substrate; an electronic circuit which is mounted on the substrate; a heat sink which is mounted on an upper surface of the electronic circuit, includes a portion which does not overlap with the electronic circuit when seen in a plan view, faces the conductor plane, and is configured of a conductive material; a conductor via which is connected to the heat sink on a surface of the heat sink contacting the electronic circuit, and extends toward the conductor plane; and a stub which is connected to the conductor via and extends to face the conductor plane.

In addition, according to the present invention, there is provided a structure which is mounted on a region except for a region contacting an electronic circuit in a surface which contacts the electronic circuit of a heat sink mounted on an upper surface of the electronic circuit mounted on a substrate having a conductor plane on an inner layer or a surface, including: a conductor via which is connected to the heat sink on the surface of the heat sink contacting the electronic circuit in a state of being mounted on the heat sink; and a stub which is connected to the conductor via, and extends to face the conductor plane in a state where the heat sink is mounted on the upper surface of the electronic circuit mounted on the substrate.

Moreover, according to the present invention, there is provided a heat sink which is mounted on an upper surface of an electronic circuit mounted on a substrate having a conductor plane on an inner layer or a surface. In addition, the structure is mounted on a region except for a region contacting the electronic circuit in a surface contacting the electronic circuit.

In a case of an electronic device of the related art, the heat sink and the conductor plane become parallel flat waveguide passages and serve as a cavity resonator having an opened end, and thus, radiation noise may occur.

In order to solve the above-described problem, in the present invention, a micro-strip line, in which the stub return-passes the conductor plane, is formed, and the stub is operated as an open stub. Moreover, in an equivalent circuit model, the parallel flat waveguide passage is referred to as inductance which is a serial impedance portion and capacitance which is a shunt admittance portion.

The electronic device of the present invention includes a unit structure in which the inductance configured of the open stub and the conductor via is added to the parallel flat wave guide passage in series as the shunt admittance. That is, the unit structure is referred to as the equivalent circuit which includes the serial impedance portion (an inductance component of the parallel flat waveguide passage) and the shunt admittance portion (a portion in which "a capacitance component of a parallel flat line" and "a component in which the inductance of the conductor via and the open stub are connected to each other in series" are connected to each other in parallel). As the electromagnetic waves propagated in the equivalent circuit are advanced in the frequency band in which the shunt admittance portion results in the inductance properties, the amplitude is attenuated. That is, in the frequency in which the shunt admittance portion results in the inductance properties, the present structure serves as an electromagnetic band gap (EBG) structure. Accordingly, a resonance phenomenon of the cavity resonator due to the electromagnetic noise from the electronic circuit is suppressed by disposing the unit structure, and the radiation noise from the heat sink can be suppressed.

According to the present invention, in the electronic device including the substrate and the heat sink, the electronic device is realized in which radiation noise in arbitrary frequency can be suppressed without decreasing thermal contact between the heat sink and the substrate.

BRIEF DESCRIPTION OF THE DRAWINGS

The above described object, other objects, characteristics, and advantages are more obvious according to the preferred embodiments described below, and the associated drawings.

DESCRIPTION OF EMBODIMENTS

Figure 1:
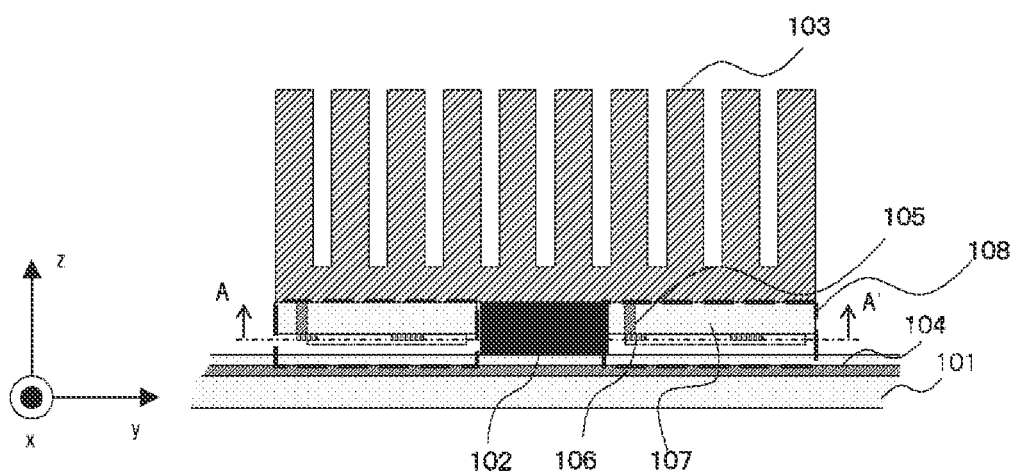
FIG. 1 is a cross-sectional view showing an example of an electronic device of the present embodiment.

Hereinafter, an embodiment of the present invention will be described with reference to the drawings. Moreover, in all drawings, the same reference numerals are attached to the same components, and the descriptions will not be repeated.

First Embodiment

Hereinafter, a first embodiment of the present invention will be described with reference to the drawings.

Figure 2:
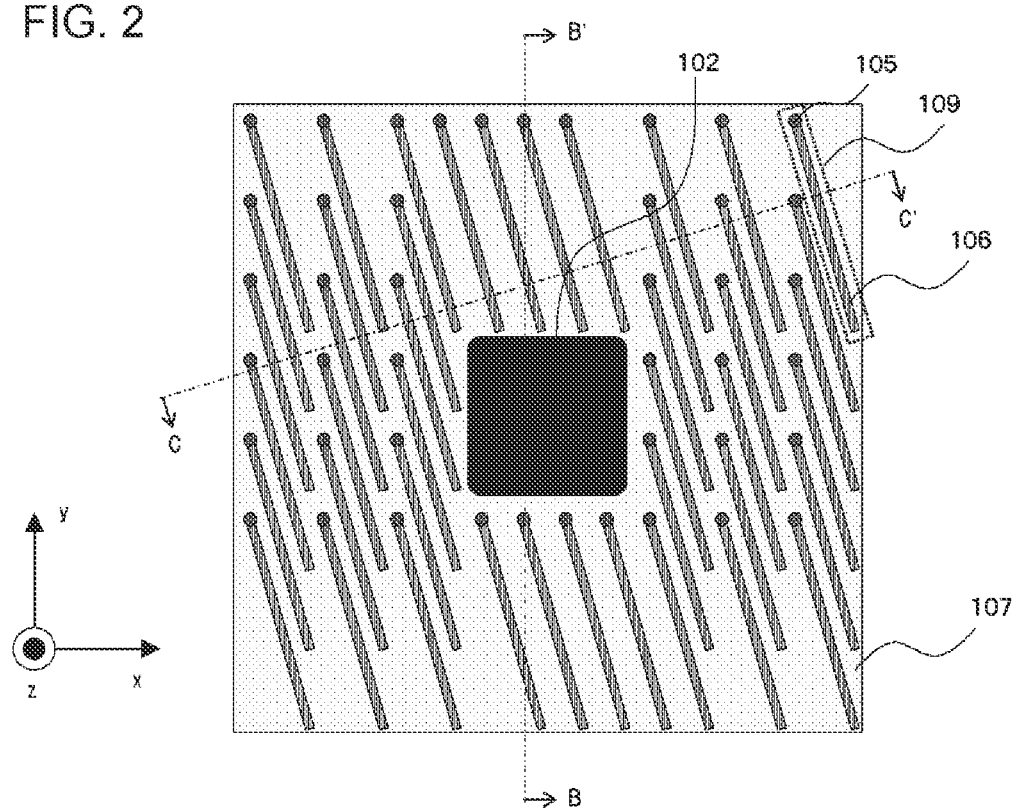
FIG. 2 is a cross-sectional view showing an example of an electronic device of the present embodiment.

FIGS. 1 and 2 are cross-sectional views of an electronic device which is the first embodiment of the present invention. FIG. 1 is a cross-sectional view taken along B-B' of FIG. 2, and FIG. 2 is a cross-sectional view taken along A-A' of FIG. 1. Moreover, as shown in FIGS. 1 and 2, an x axis, a y axis, and a z axis are defined.

As shown FIG. 1, the electronic device of the present embodiment includes a substrate 101, an electronic circuit 102, and a heat sink 103. The electronic circuit 102 such as an IC and an LSI is mounted on the substrate 101, and the heat sink 103 is mounted on the electronic circuit 102.

The substrate 101 includes a conductor plane 104 which is configured of copper, aluminum, or the like on a surface of a side to which the electronic circuit 102 is mounted, or an inner layer. The conductor plane 104 is provided to face the heat sink 103. In the case of the shown example, the conductor plane 104 is provided to be parallel to an x-y plane. In addition, when the conductor plane 104 is provided on the inner layer of the substrate 101, it is not particularly limited that the conductor plane 104 is formed on any layer in the substrate 101. For example, the conductor plane 104 may be formed in the vicinity of the front layer of the substrate 101. Specifically, the layer of the conductor plane 104 may be formed on a layer immediately below a resist layer formed on the surface of the substrate 101. In addition, according to the example, the conductor plane 104 may be formed on a layer lower than the inside of the substrate 101. That is, the layer of the conductor plane 104 may be formed on a layer lower than a layer of a signal wire or the like formed in the substrate 101. In this way, the laminated structure of the substrate 101 is not particularly limited. However, it is preferable that a layer configured of a conductive material such as interconnects be not positioned in the vicinity of a stub 106 described below.

The heat sink 103 is configured of a conductive material such as a metal. The heat sink 103 includes a portion which does not overlap with the electronic circuit 102 when seen in a plan view, and the portion faces the conductor plane 104.

A layer of a dielectric 107 (hereinafter, referred to as a "dielectric layer 107") is formed on at least a portion of a region other than a region in which the heat sink 103 contacts the electronic circuit 102, in a surface (hereinafter, referred to as a "first surface") of the side of the heat sink 103 which contacts the electronic circuit 102. Moreover, the dielectric layer 107 may be formed on the first surface through a conductive layer (not shown in the drawing) configured of copper or the like. In this way, a connection between a conductor via 105 described below and the heat sink 103 can be sufficiently secured. The shape of the first surface of the heat sink 103 is not particularly limited, and may be all shapes such as a rectangle, other polygons, and a circle, in addition to a square shown in FIG. 2.

At least one conductor via 105 which is connected to the heat sink 103 exists in the inner portion of the dielectric layer 107. When the conductive layer (not shown in the drawings) exists between the heat sink 103 and the dielectric layer 107, the conductor via 105 is connected to the heat sink 103 via the conductive layer. That is, the conductor via 105 is connected to the heat sink 103 on the surface of the heat sink 103 which contacts the electronic circuit 102. Moreover, the conductor via 105 extends toward the conductor plane 104. In addition, one end of the conductor via 105 does not contact the conductor plane 104.

At least one stub 106 is formed on a surface (surface of the lower side) opposite to the surface of the dielectric layer 107 contacting the heat sink 103, or in the inner portion of the dielectric layer 107 to face the conductor plane 104.

The stub 106 is configured of a conductive material, is connected to the conductor via 105 through one end side, and extends to face the conductor plane 104. The stub 106 shown in FIG. 2 is connected to the conductor via 105 through one end, and linearly extends to be parallel to the x-y plane.

Figure 3:
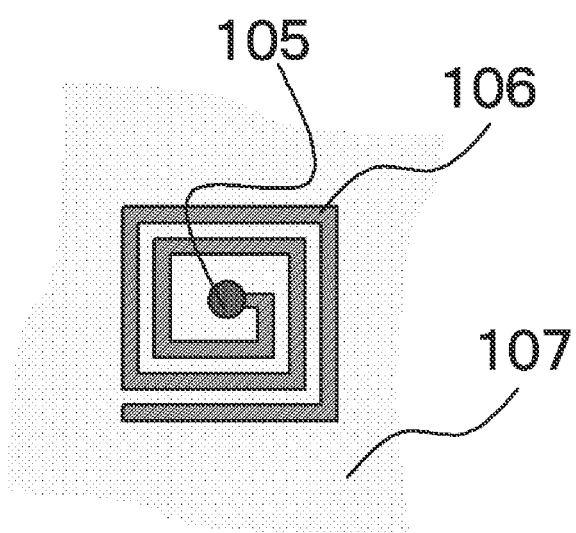
FIG. 3 is a plan view showing an example of a planar shape of a stub of the present embodiment.
Figure 4:
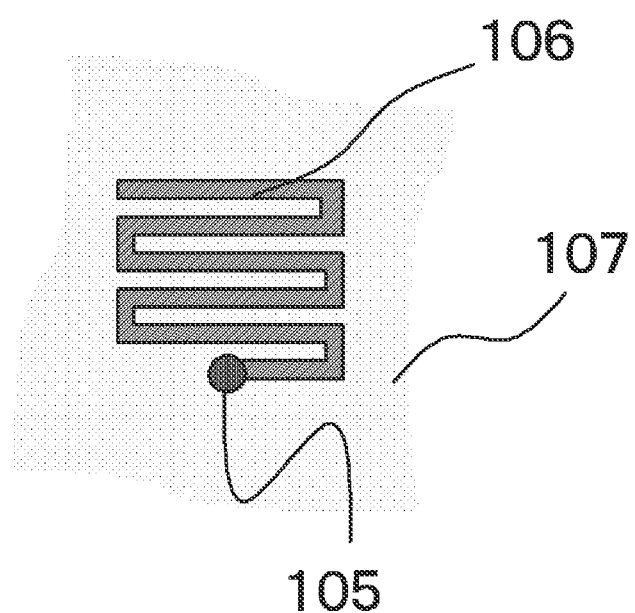
FIG. 4 is a plan view showing an example of a planar shape of a stub of the present embodiment.
Figure 5:
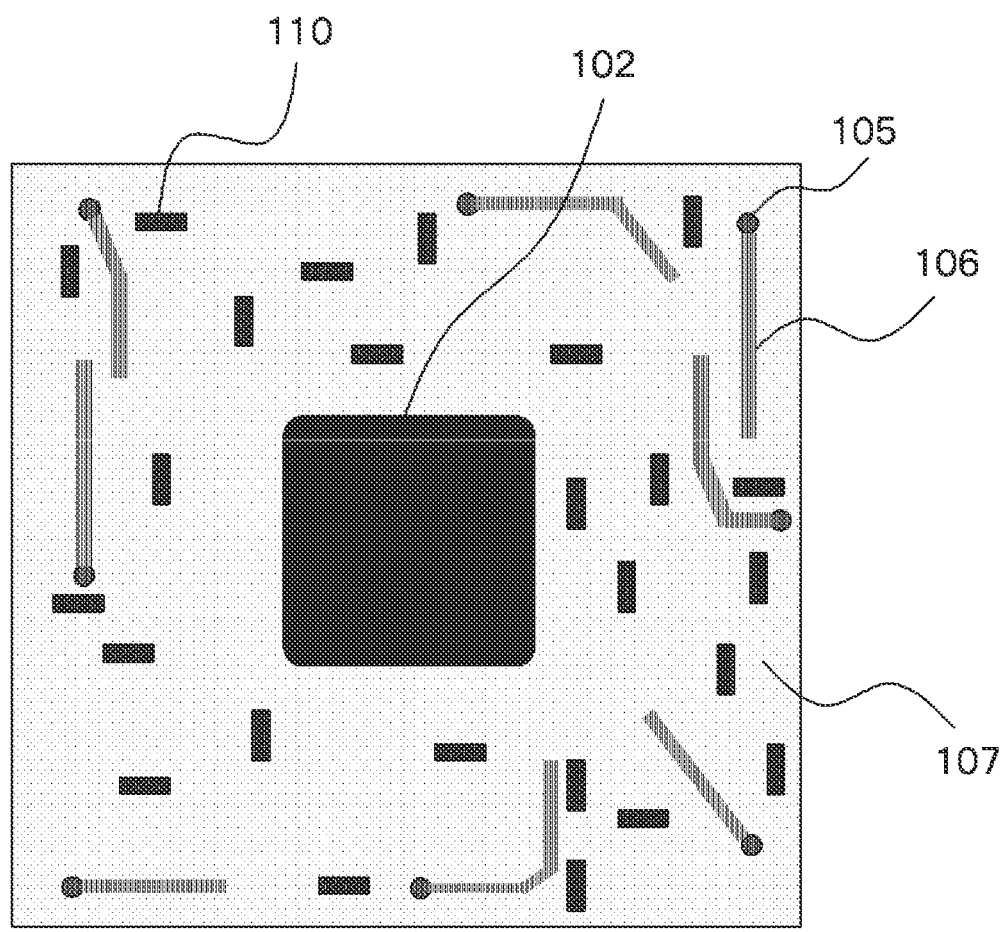
FIG. 5 is a cross-sectional view showing an example of an electronic device of the present embodiment.

Moreover, the shape of the stub 106 is not limited to the linear shape, and can select all shapes within a range which does not influence the essential effects of the present embodiment described below. For example, the shape of the stub may be a spiral shape shown in FIG. 3, a meander shape shown in FIG. 4, or other shapes. Moreover, when the plurality of stubs 106 are provided, all planar shapes of the plurality of stubs 106 may be the same as one another, or a different shape may be mixed. In this way, the essential effects of the present embodiment described below are not influenced. In this case, since a degree of freedom of disposition of the stub 106 is increased, even though the region in which the stub 106 is disposed has any shape or size, more stubs 106 can be disposed. For example, as shown in FIG. 5, even when an electronic component 110 exists on the surface of the substrate 101, the electronic component 110 reaches a height in which the stub 106 is disposed, and the disposition of the stub 106 is interrupted, the stub 106 can be disposed to avoid the electronic component 110.

Return to FIGS. 1 and 2, the electronic device of the present embodiment includes at least one unit structure 109 which includes the stub 106, the conductor via 105 connected to the stub 106, a partial region which includes a region of the conductor plane 104 facing the stub 106, and a partial region which includes a region of the heat sink 103 facing the stub 106. Moreover, when the electronic device includes the plurality of unit structures 109, the unit structures 109 may be repeatedly (for example, periodically) disposed with a constant regularity. However, the dispositions of the unit structures are not limited to the above-described disposition.

Here, when the first surface moves to the conductor plane 104 to be parallel in the z axis direction, the region through which the surface passes is indicated by a region (i) 108 (refer to FIG. 1).

Figure 6:
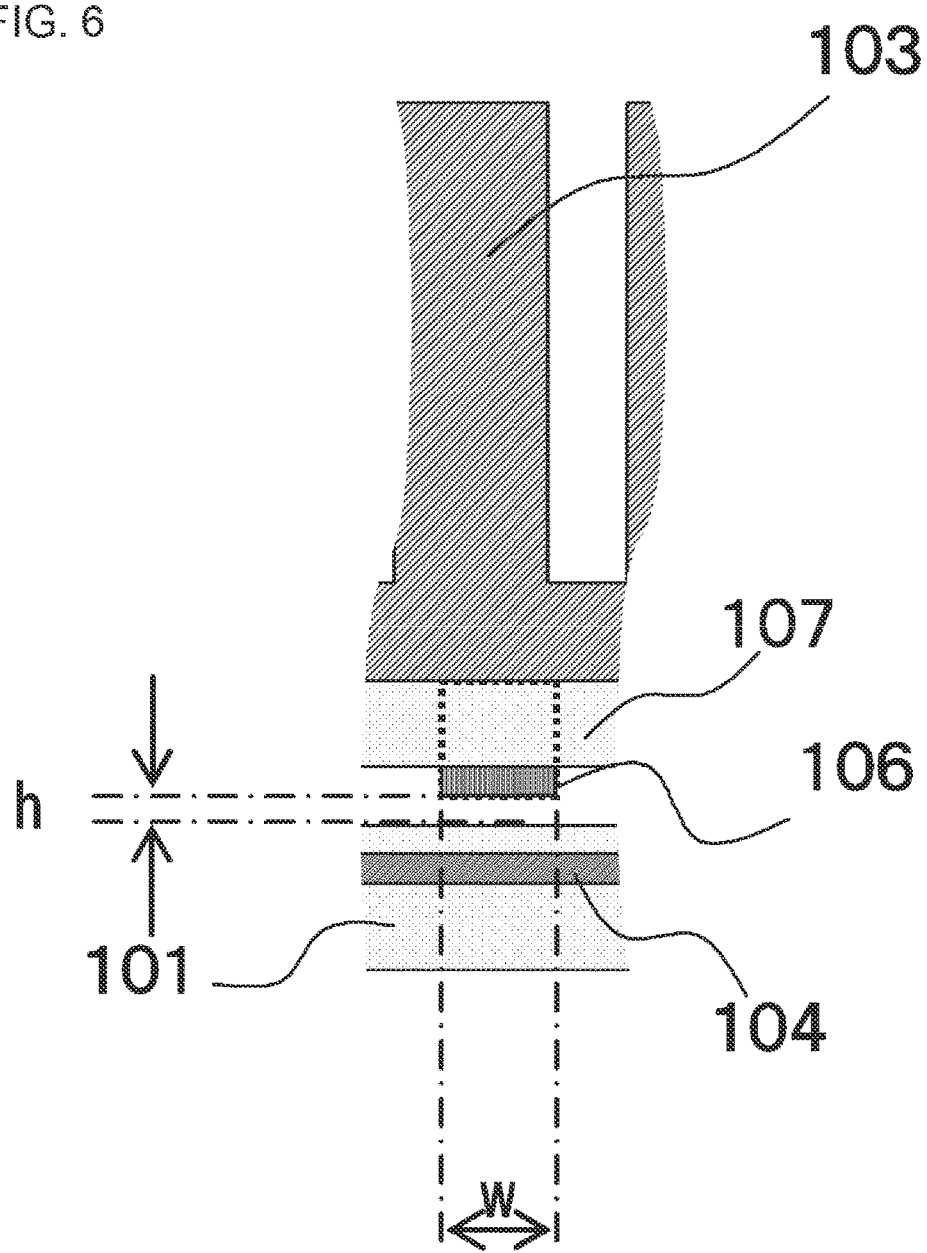
FIG. 6 is a cross-sectional view showing an example of an electronic device of the present embodiment.
Figure 7:
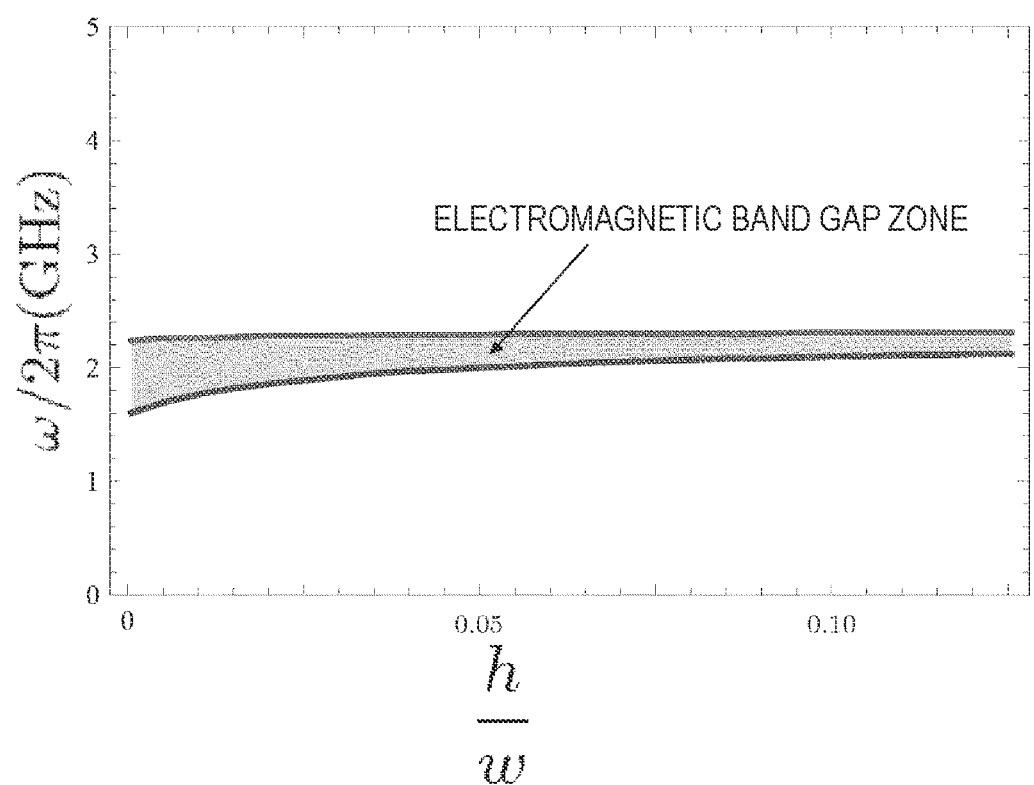
FIG. 7 is a view for illustrating effects of the electronic device of the present embodiment.

FIG. 6 shows a portion (near the unit structure 109) of the cross-sectional view taken along C-C' of FIG. 2. In the present embodiment, it is preferable that a ratio (h/w) between a width w of the stub 106 and a distance h between the stub 106 and the conductor plane 104 be decreased, and specifically, it is preferable that h/w be 1 or less. Here, FIG. 7 shows an example of a graph in which h/w dependence of the frequency band of the electromagnetic band gap is plotted based on an equivalent circuit. As is obvious from FIG. 7, in the electronic device of the present embodiment, the smaller h/w is, the wider the frequency band, which serves as an electromagnetic band gap structure, is. That is, the h/w is designed to be a small value, and thus, the radiation noise can be controlled at a wide frequency band.

Figure 8:
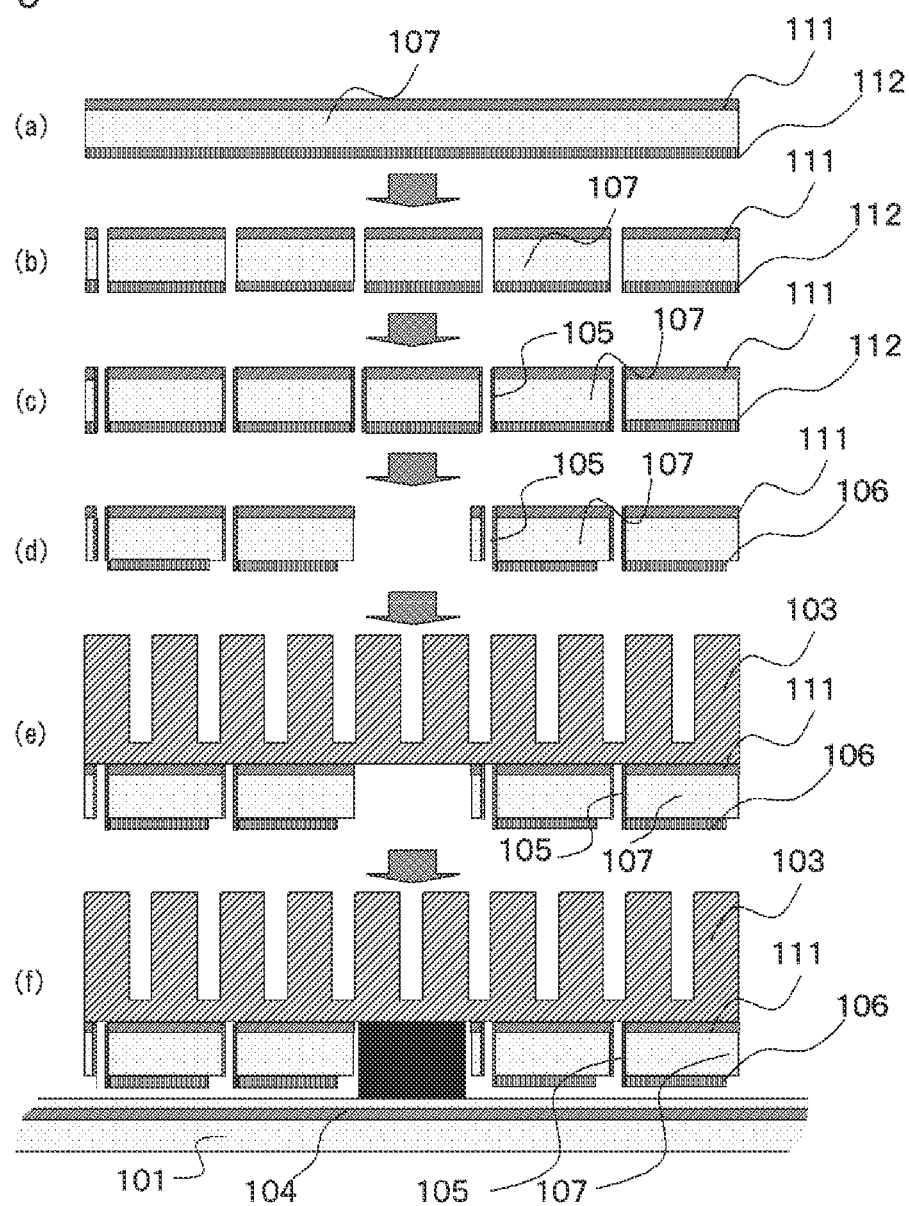
FIG. 8 is a cross-sectional process diagram showing an example of a manufacturing method of the electronic device of the present embodiment.

Next, an example of a manufacturing method of the electronic device of the present embodiment will be described with reference to FIG. 8. FIG. 8 is a cross-sectional view showing an example of a manufacturing process of the present embodiment.

First, as shown in (a), the dielectric layer 107 (dielectric substrate) in which copper foils 111 and 112 are formed on both surfaces is prepared. Subsequently, as shown in (b), through holes passing through the copper foils 111 and 112 and the dielectric layer 107 are formed using a drill, the conductor vias 105 are formed by plating copper in the inner portions of the through holes, and thus, a state shown in (c) is obtained. Moreover, the conductor vias 105 are connected to the copper foils 111 and 112.

Thereafter, the stubs 106 are formed by forming a predetermined pattern on the copper foil 112 through etching. Subsequently, in order to secure the region in which the electronic circuit 102 and the heat sink 103 contact each other, a partial region of the copper foil 111, the stub 106, and the dielectric layer 107 is hollowed out, and a state of (d) is obtained. Thereafter, as shown in (e), the structure shown in (d) is stuck to the lower surface of the heat sink 103. The sticking is performed using a conductive adhesive, a tape, or the like, and thus, the connection between the conductor via 105 and the heat sink 103 through the copper foil 111 is secured.

Thereafter, as shown in (f), the substrate 101 is prepared. The substrate 101 includes the conductor plane 104 on the surface of the side on which the electronic circuit 102 is mounted, or in the inner layer, and the electronic circuit 102 is mounted at a predetermined position. The electronic device of the present embodiment is obtained by mounting the structure shown in (e) on the electronic circuit 102.

Next, effects of the present embodiment will be described.

Figure 9:
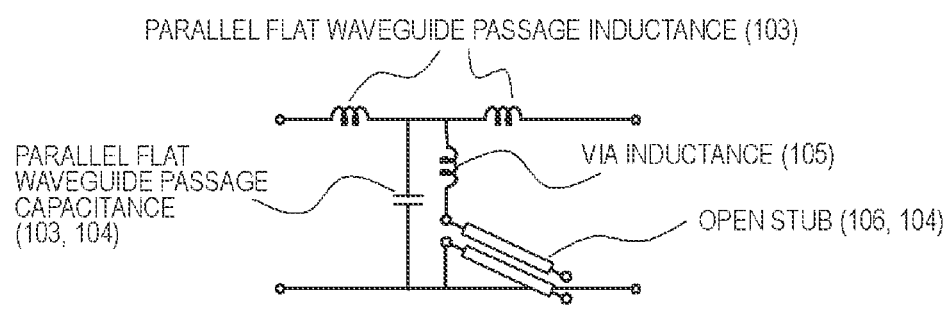
FIG. 9 is an equivalent circuit diagram of a unit structure of the present embodiment.

FIG. 9 shows an equivalent circuit diagram of the unit structure which is included in the electronic device of the present embodiment. In the electronic device of the present embodiment, the first surface of the heat sink 103 and the conductor plane 104 provided in the substrate 101 form a parallel flat waveguide passage. Moreover, the stub 106 forms a micro-strip line which return-passes the conductor plane 104, and functions as an open stub. Serial impedance and shunt admittance of the equivalent circuit are represented by the following Expressions (1) and (2), respectively. Moreover, β included in Expression (2) is represented by Expression (3).

[Expression 1]

$$Z=j\omega L_{ppw} \quad (1)$$

[Expression 2]

$$Y=j\omega C_{ppw}+1/(-jZ_{OS}\cot\beta 1+j\omega L_{via}) \quad (2)$$

[Expression 3]

$$\beta=\omega\sqrt{(\epsilon_{eff}\epsilon_0\mu_0)} \quad (3)$$

j: imaginary unit
ω: angular frequency
$L_{ppw}$: parallel flat waveguide passage inductance
$C_{ppw}$: parallel flat waveguide passage capacitance
$Z_{OS}$: open stub characteristic impedance β: phase constant of open stub
l: stub length of open stub
$L_{via}$: conductor via inductance
$\epsilon_{eff}$: effective relative permittivity of open stub
$\epsilon_0$: permittivity in vacuum
$\mu_0$: permeability in vacuum
Z: serial impedance of transmission line
Y: shunt admittance of transmission line Moreover, propagation of an electric field component of an electromagnetic wave of one-dimensional transmission line is represented by the following Expression (4) by setting a travelling direction of the electromagnetic wave to the x axis direction and excepting a time dependence factor. Moreover, γ included in Expression (4) is represented by Expression (5).

[Expression 4]

$$E=E_0 e^{-\gamma x}(x>0) \quad (4)$$

[Expression 5]

$$\gamma=\sqrt{ZY} \quad (5)$$

E: electric field component of electromagnetic wave of one-dimensional transmission line
$E_0$: amplitude of electric field component of electromagnetic wave of one-dimensional transmission line
γ: propagation constant in one-dimensional transmission line According to Expressions (1) to (5), in the frequency in which Expression (2) results in inductance properties (Im [Y]<0), Expression (4) results in an electric field which is attenuated as it is advanced in the positive x axis direction, and it is understood that the present structure has characteristics as the electromagnetic band gap. That is, the present structure serves as the electromagnetic band gap structure in the frequency band in which Expression (2) results in the inductance properties. Since the propagation of the electromagnetic waves is prohibited in the electromagnetic band gap structure, the structure can be used for suppressing a resonance phenomenon. Moreover, the structure can be used for suppressing the radiation noise from the heat sink 103.

Moreover, according to Expression (2), it is understood that the frequency band, which becomes the electromagnetic band gap structure, can be adjusted by adjusting the length of the stub 106 which configures a shunt admittance portion. That is, according to the adjustment of stub length, the structure can control the frequency band serving as the electromagnetic band gap structure.

Figure 10:
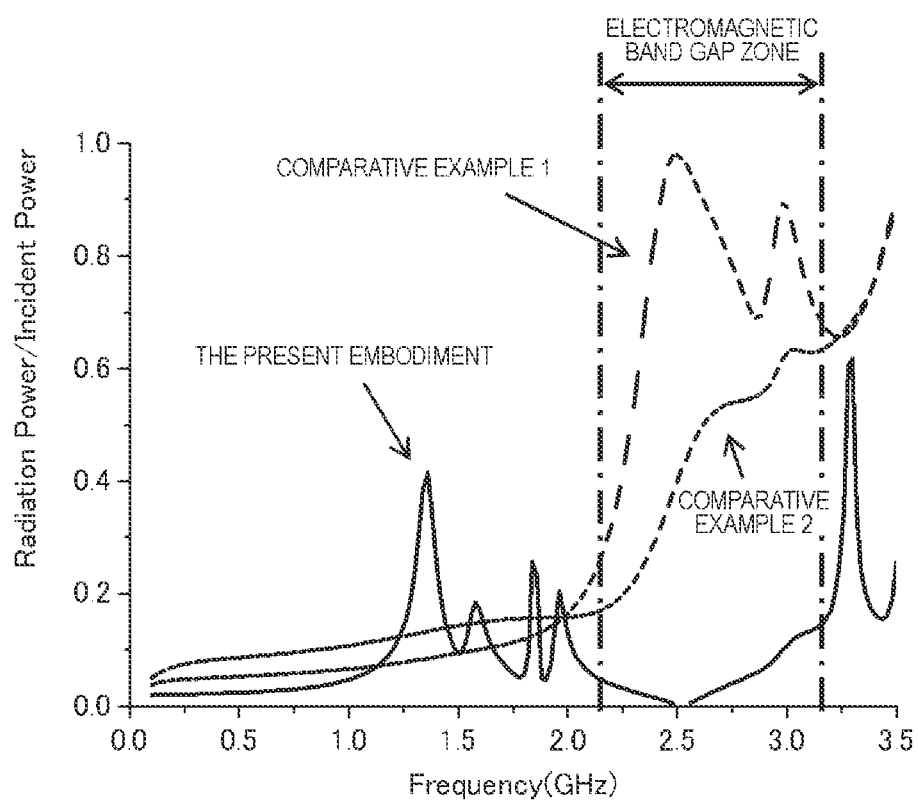
FIG. 10 is a view for illustrating effects of the electronic device of the present embodiment.

FIG. 10 shows a graph in which the electronic device of the present embodiment and the electronic device of Comparative Example are analyzed according to an electromagnetic field analysis, and radiation noise amounts are compared. "Comparative Example 1" has configuration which is similar to the electronic device of the present embodiment except that the unit structure included in the present embodiment is not provided. "Comparative Example 2" has configuration which is similar to the electronic device of the present embodiment except that the dielectric layer 107, the conductor via 105, and the stub 106, which are included in the present embodiment, are not provided.

As is obvious from the graph, in the frequency band (hatched portion in the drawing) in which the electronic device (solid line in the drawing) of the present embodiment serves as the electromagnetic band gap structure, it is understood that the radiation noise amount from the electronic device of the present embodiment is smaller than the radiation noise amount from the electronic devices of the Comparative Examples 1 and 2. That is, it is understood that the radiation noise amount is decreased by the electronic device of the present embodiment.

According to the electronic device of the present embodiment described above, the propagation of the electromagnetic waves in the region (i) 108 can be suppressed.

Moreover, in the case of the present embodiment, since it is not necessary to insert a special material between the electronic circuit 102 and the heat sink 103, heat dissipation performance of the heat sink 103 is not interfered with essentially.

Furthermore, in the case of the present embodiment, the frequency having the radiation noise suppression effects can be adjusted by adjusting the length of the stub 106. Accordingly, the present embodiment can be applied to the radiation noise suppression in arbitrary frequency.

In addition, in the case of the present embodiment, since it is not necessary to provide the mounting space of the technology described in Patent Document 2 on the inner layer of the substrate 101, the radiation noise suppression effects can be realized with space saving.

Second Embodiment

Hereinafter, a second embodiment of the present invention will be described with reference to the drawings. In the present embodiment, the relationship between the stub and the conductor via is different from that of the first embodiment. Other configurations are similar to those of the first embodiment, and here, the descriptions will not be repeated.

Figure 11:
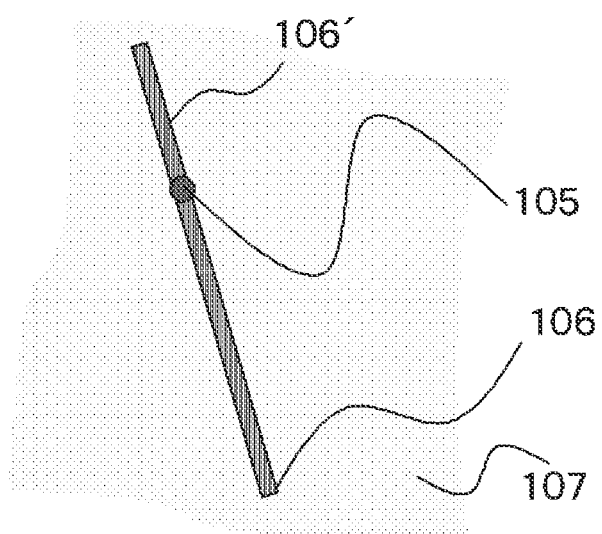
FIG. 11 is a plan view showing an example of a planar shape of the stub of the present embodiment.
Figure 12:
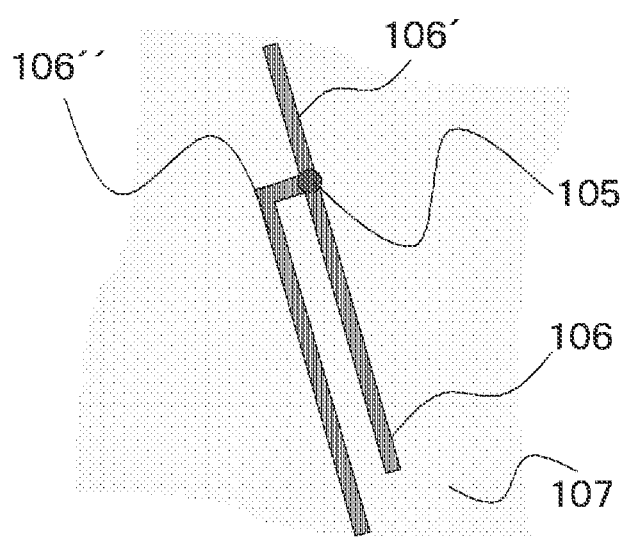
FIG. 12 is a plan view showing an example of the planar shape of the stub of the present embodiment.

FIGS. 11 and 12 are plan views showing the relationship between the stub and the conductor via of the present embodiment. In the first embodiment, one stub 106 is connected to one conductor via 105 (refer to FIGS. 2 to 5). On the other hand, in the present embodiment, for example, two stubs 106 and 106' may be connected to one conductor via 105 (refer to FIG. 11). In addition, in the present embodiment, for example, three stubs 106, 106', and 106" may be connected to one conductor via 105 (refer to FIG. 12). Moreover, in the present embodiment, four or more stubs may be connected to one conductor via 105. The planar shape of each stub is not particularly limited, and may select all shapes.

Furthermore, when the electronic device of the present embodiment includes the plurality of conductor vias 105, the number of the stubs connected to each conductor via 105 may be the same as each other, and different numbers may be mixed. Moreover, the conductor via 105 to which only one stub is connected may exist.

Moreover, among the plurality of stubs which are connected to one conductor via 105, the stubs having lengths (stub lengths) different from one another may be mixed. For example, all lengths of the plurality of stubs which are connected to one conductor via 105 may be different from one another. In addition, all lengths of the plurality of stubs which are connected to one conductor via 105 may be same as one another.

The manufacturing method of the electronic device of the present embodiment may be realized similarly to the first embodiment. That is, the electronic device of the present embodiment can be manufactured by changing to match the pattern when the stub is formed by etching the copper foil 112 from the state shown in FIG. 8(c), with the present embodiment, and by performing other processes to be similar to the first embodiment.

According to the electronic device of the present embodiment, the following effects in addition to the effects similar to the first embodiment are realized.

The unit structure 109 of the present embodiment is configured to include the conductor via 105, one or more stubs which are connected to the conductor via 105, a partial region which includes a region of the conductor plane 104 facing one or more stubs, and a partial region which includes a region of the heat sink 103 facing one or more stubs.

Figure 13:
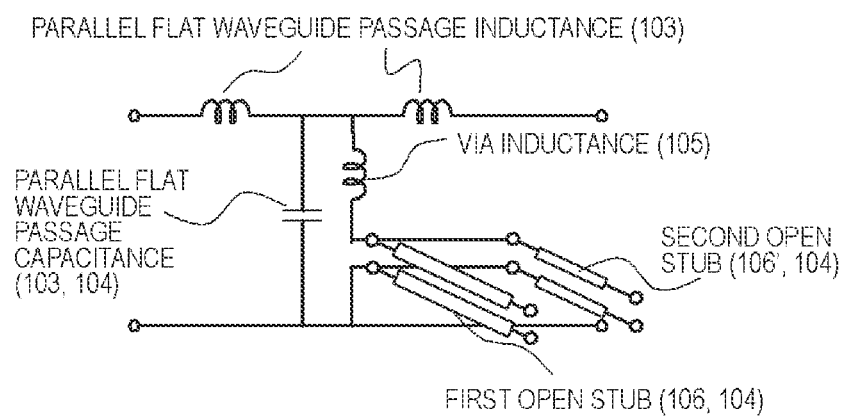
FIG. 13 is an equivalent circuit diagram of the unit structure of the present embodiment.
Figure 14:
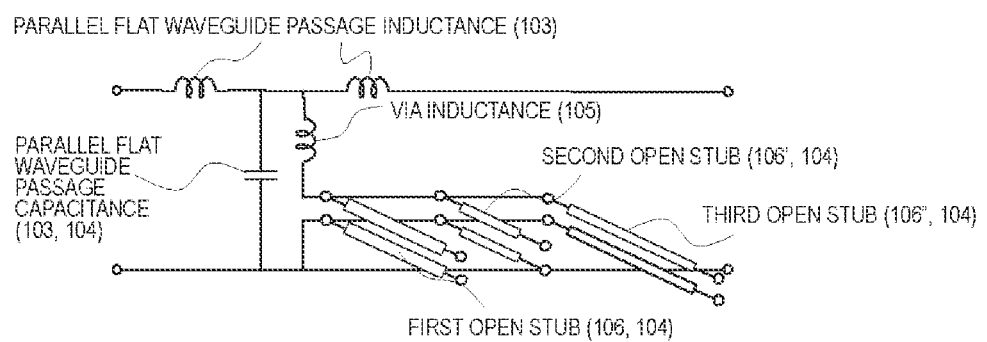
FIG. 14 is an equivalent circuit diagram of the unit structure of the present embodiment.

Here, FIG. 13 shows an equivalent circuit diagram of the unit structure in which two stubs 106 and 106' are connected to one conductor via 105 as shown in FIG. 11. Moreover, FIG. 14 shows an equivalent circuit diagram of the unit structure 109 in which three stubs 106, 106', and 106" are connected to one conductor via 105 as shown in FIG. 12.

As described in the first embodiment, the frequency band in which the structure of the present embodiment serves as the electromagnetic band gap structure can be adjusted by the length of the stub. In the case of the present embodiment, the plurality of stubs having lengths different from one another may be provided in the unit structure 109. In the frequency band corresponding to each stub length, the case serves as the electromagnetic band gap structure. The frequency bands of the radiation noise capable of suppressing the propagation by the unit structure 109 become frequency bands which include all frequency bands corresponding to each stub length. That is, according to the present embodiment, the frequency of the radiation noise capable of suppressing the propagation is widened. Moreover, in the present embodiment, the frequency band of the radiation noise capable of suppressing the propagation may be a continuous range (for example, 1 GHz to 5 GHz), and may be an intermittent range (1 GHz to 2.5 GHz and 3.5 GHz to 5 GHz).

Moreover, when the plurality of stubs having the same stub lengths as one another are provided in the unit structure, the stubs have effects which widens the band of the electromagnetic band gap corresponding to the stub length. That is, the radiation noise can be suppressed in a more wide frequency band.

Third Embodiment

Hereinafter, a third embodiment of the present embodiment will be described with reference to the drawings. In the present embodiment, the configuration of a space, which is interposed between the substrate 101 including the conductor plane 104 and the dielectric layer 107 in which the conductor via 105 and the stub 106 are formed, is different from those of the first and second embodiments. Other configurations are similar to those of the first or the second embodiment, and here, the descriptions will not be repeated.

Figure 15:
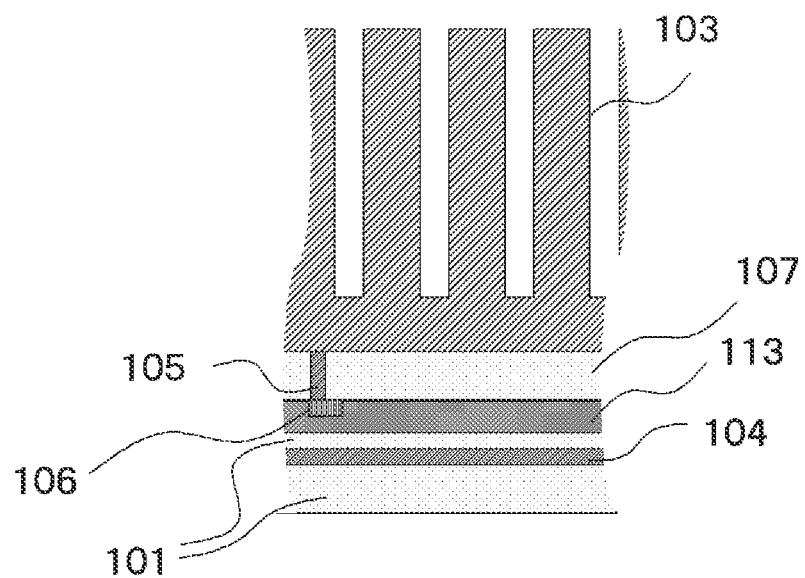
FIG. 15 is a cross-sectional view showing an example of the electronic device of the present embodiment.

FIG. 15 is a cross-sectional view in which a portion of an electronic device of the present embodiment is extracted. In the first and second embodiments, the cavity filled with air exists in the space which is interposed between the substrate 101 including the conductor plane 104 and the dielectric layer 107 in which the conductor via 105 and the stub 106 are formed (refer to FIG. 1). On the other hand, in the present embodiment, a portion or the whole of the cavity is embedded with a dielectric layer 113.

As the manufacturing method of the electronic device of the present embodiment, for example, the electronic device may be formed by making dielectric materials having flowability flow into the cavity formed between the conductor plane 104 and the stub 106 after obtaining the state of FIG. 8(f) by performing the processes similar to the first and second embodiments, and thereafter, solidifying the dielectric materials.

Figure 16:
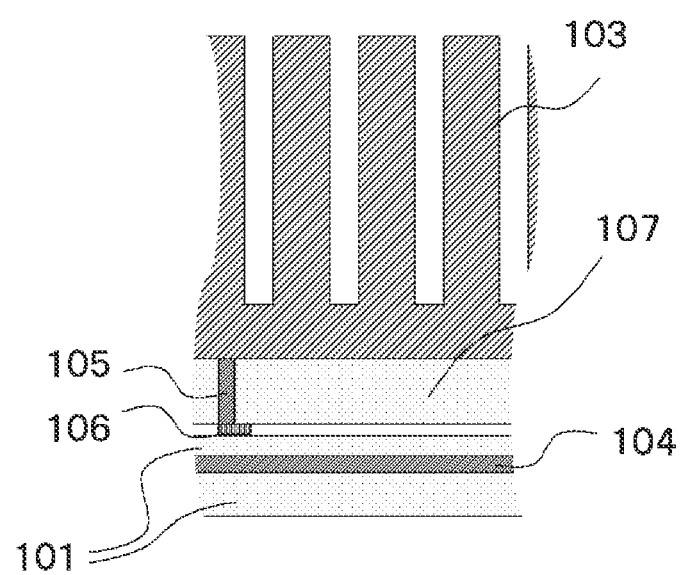
FIG. 16 is a cross-sectional view showing an example of the electronic device of the present embodiment.

Alternatively, if the heat sink 103 is mounted on the electronic circuit 102 as shown in FIG. 8(f) by making the thickness of the dielectric layer 107 in which the copper foils 111 and 112 are formed on both surfaces shown in FIG. 8(a) be the same as the thickness of the electronic circuit 102, the cavity may be designed to be removed (refer to FIG. 16). In this case, as shown in FIG. 16, a level difference equivalent to the thickness of the stub 106 is formed between the stub 106 formed by patterning the copper foil 112 and a region in which the stub 106 is not formed. Moreover, a slight cavity remains in the vicinity of the level difference. However, since the cavity is sufficiently small, effects of the present embodiment described below can be sufficiently realized.

In addition, in the case of the example shown in FIG. 16, the conductor plane 104 is formed in the inner portion of the substrate 101, and the dielectric layer which is a portion of the substrate 101 exists between the conductor plane 104 and the stub 106. That is, the conductor plane 104 and the stub 106 do not contact each other.

According to the electric device of the present embodiment, the following effects in addition to the effects similar to the first and second embodiments are realized.

According to Expression (3), the frequency dependence of the input impedance of the open stub, in which the stub is formed, is increased as the effective relative permittivity of the open stub is increased. That is, by using a material (for example, dielectric ceramics for Low Temperature Cofired Ceramics (LTCC)) having high relative permittivity as the material used in the dielectric layer 113 shown in FIG. 15, it is possible to make the frequency band serving as the electromagnetic band gap structure be low frequency without lengthening the stub length.

In addition, also in the structure shown in FIG. 16, since the volume occupied by the cavity is decreased, the effective permittivity of the open stub is larger than the permittivity of vacuum. Accordingly, in the case of the present embodiment, miniaturization of the unit structures shown in the first and second embodiments is possible. As a result, the number of the unit structures, which can be disposed per unit area, can be increased.

Fourth Embodiment

Hereinafter, a fourth embodiment of the present invention will be described with reference to the drawings. The present embodiment is different from the first to third embodiments in that a plurality of kinds of unit structures 109, in which the frequency bands of the radiation noise capable of suppressing the propagation are different from one another, are disposed. Other configurations are similar to those of the first, the second, or the third embodiment, and here, the descriptions will not be repeated.

Figure 17:
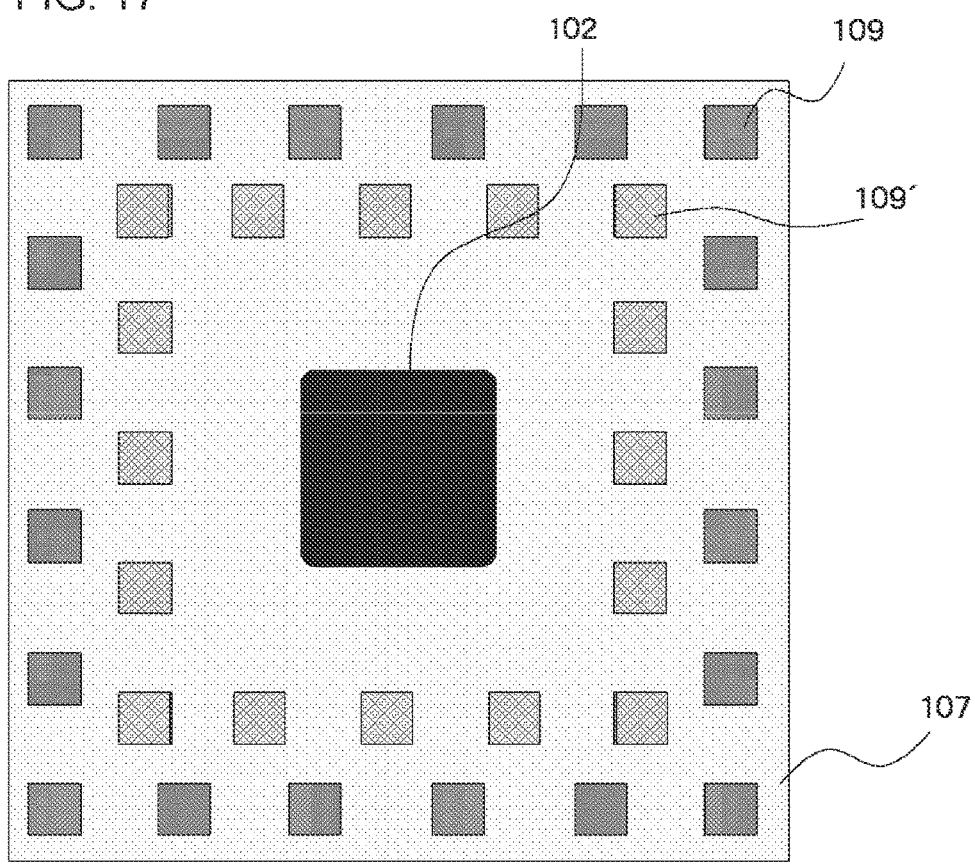
FIG. 17 is a cross-sectional view showing an example of the electronic device of the present embodiment.
Figure 18:
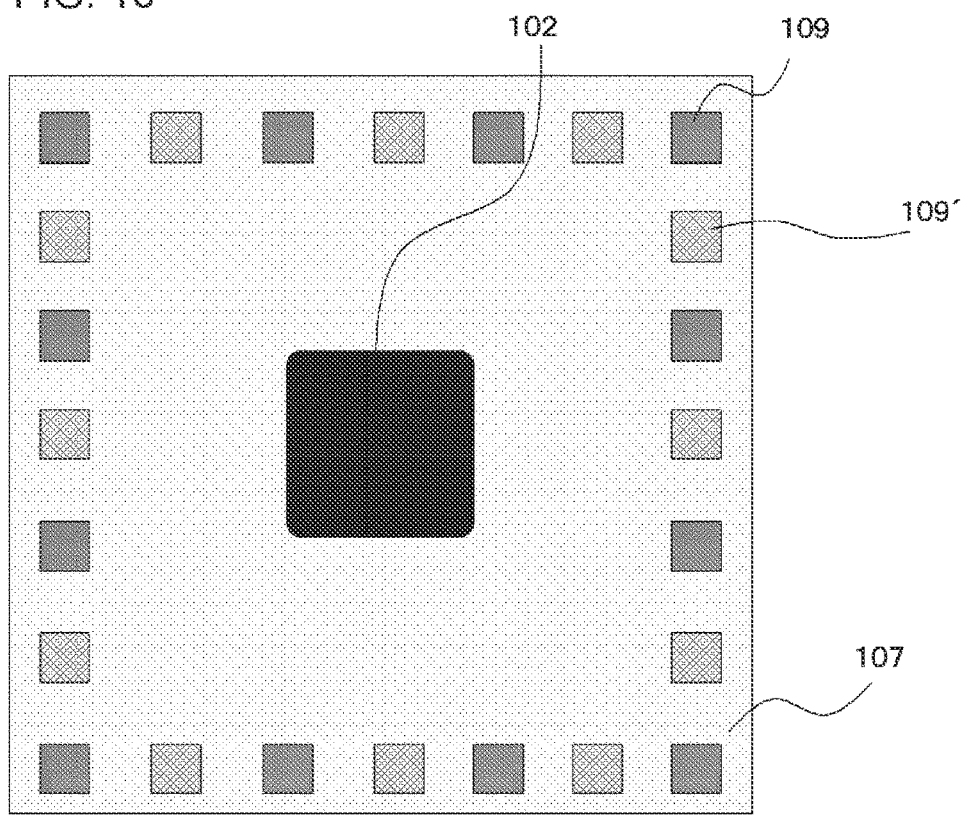
FIG. 18 is a cross-sectional view showing an example of the electronic device of the present embodiment.

FIGS. 17 and 18 are cross-sectional views of an electronic device of the present embodiment, and correspond to FIG. 2 used in the descriptions of the first embodiment. In addition, also in FIGS. 17 and 18, the unit structure 109 is simply shown in a square.

In the case of the example shown in FIG. 17, second unit structures 109' are disposed in a doughnut shape to enclose the electronic circuit 102, and first unit structures 109 are disposed in a doughnut shape to enclose the electronic circuit 102 at the outer circumferences of the second unit structures.

In the first unit structure 109 and the second unit structure 109', the frequency bands of the radiation noise capable of controlling the propagation are different from each other. As a method for realizing this configuration, a method, which makes the length of the stub 106 included in the first unit structure 109 and the length of the stub 106 included in the second unit structure 109' be different from each other, is considered. Moreover, a method, which makes the number of the stubs 106 included in each unit structure be different from one another, is also considered. In addition, "the frequency bands of the radiation noise capable of suppressing the propagation being different from one another" means that the frequency bands do not completely coincide with one another, and the frequency bands may be partially overlapped with each other.

In the case of the example shown in FIG. 18, the first unit structures 109 and the second unit structures 109' are alternately disposed in a doughnut shape to enclose the electronic circuit 102 in a line.

Moreover, in the cases of the examples shown in FIGS. 17 and 18, two kinds of unit structures are disposed. However, three or more kinds of unit structures may be disposed. In addition, the number of various unit structures disposed is not limited, and one or the plurality of unit structures may be disposed. Moreover, the number of the disposed unit structures may be different from one another for each kind. In addition, as shown in FIGS. 17 and 18, the unit structures may be disposed with regularity, or the unit structures may be randomly disposed without regularity.

The manufacturing method of the electronic device of the present embodiment can be realized according to the manufacturing method described in the first to third embodiments.

According to the electronic device of the present embodiment, the following effects in addition to the effects similar to the first to third embodiments are realized.

As described in the first embodiment, the frequency band in which the structure of the present embodiment serves as the electromagnetic band gap structure can be adjusted by the length of the stub. That is, for example, when the stub lengths of the plurality of kinds of unit structures included in the electronic device of the present embodiment are different for each unit structure, the respective unit structures have characteristics of respective electromagnetic band gaps corresponding to respective stub lengths. Moreover, when the number of the stubs included respective unit structures are different from one another, the respective unit structures have characteristics of respective electromagnetic band gaps corresponding to the numbers and the lengths of the respective stubs.

According to the electronic device of the present embodiment including the plurality of kinds of unit structures having different characteristics of the electromagnetic band gaps, the plurality of kinds of unit structures can realize the characteristics of the electromagnetic band gaps covering a wide frequency band as a whole. As a result, the radiation noise can be suppressed in a wide frequency band. Moreover, in the present embodiment, the frequency band of the radiation noise capable of suppressing the propagation may be a continuous range (for example, 1 GHz to 5 GHz), and may be an intermittent range (for example, 1 GHz to 2.5 GHz and 3.5 GHz to 5 GHz).

Fifth Embodiment

Hereinafter, a fifth embodiment of the present invention will be described with reference to the drawings. In the present embodiment, the disposition method of the unit structures 109 is different from those of the first to fourth embodiments. Other configurations are similar to those of the first, the second, the third, or the fourth embodiment, and here, the descriptions will not be repeated.

Figure 19:
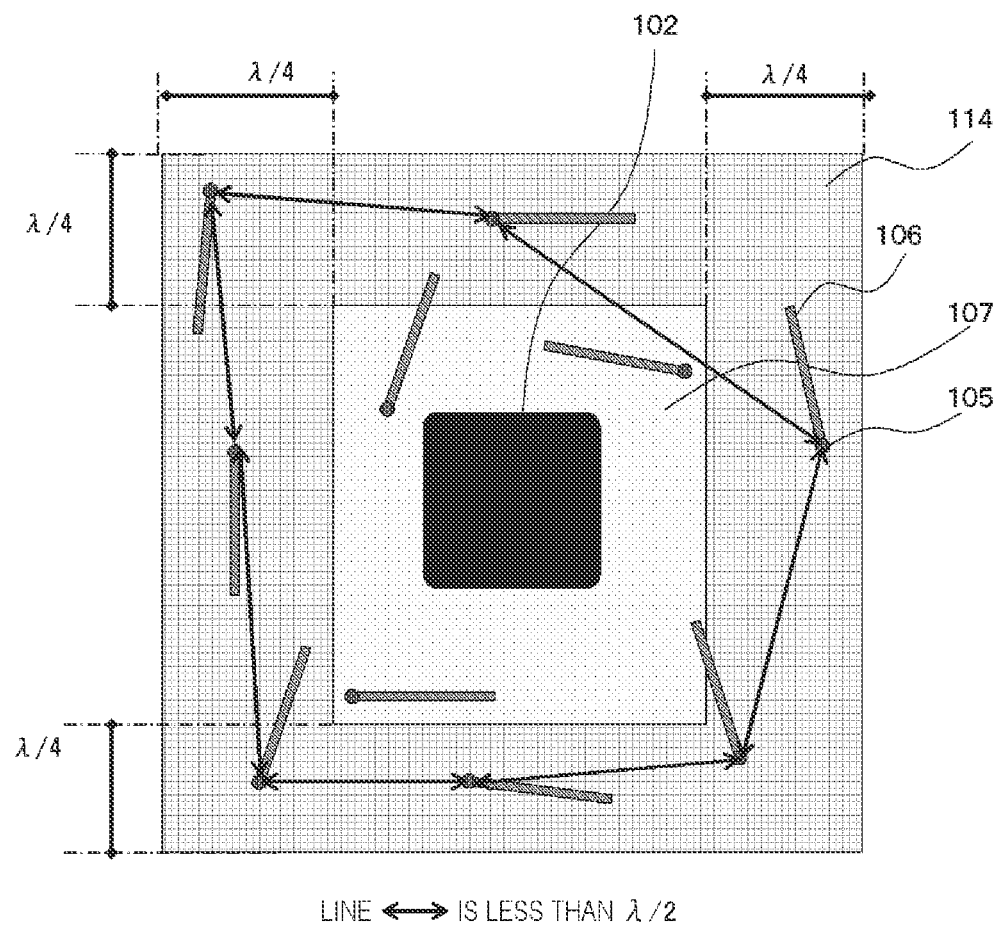
FIG. 19 is a cross-sectional view showing an example of the electronic device of the present embodiment.

FIG. 19 is a cross-sectional view of an electronic device of the present embodiment, and corresponds to FIG. 2 used in the descriptions of the first embodiment. When a wavelength with respect to the frequency of the electromagnetic wave for obtaining the radiation noise suppression effects is defined as $\lambda$, a region in which a distance from the end of the heat sink is less than $\lambda/4$, preferably, a region in which the distance is less than $\lambda/8$ is referred to as a region (ii) 114.

In the present embodiment, the unit structure 109 having the conductor via 105 in the region (ii) 114 is provided in plural, and the plurality of unit structures 109 are disposed to have the following relationship. That is, when an arbitrary one is selected among the plurality of unit structures 109 having the conductor via 105 in the region (ii) 114, at least one conductor via 105 included in another unit structure 109 is positioned at a distance less than $\lambda/2$ from the conductor via 105 of the unit structure 109, preferably, within $\lambda/4$. The conductor via 105 is positioned in the region (ii) 114. Moreover, as shown in the drawing, in the present embodiment, the unit structure 109 which does not have the conductor via 105 in the region (ii) 114 may be also provided.

Figure 20:
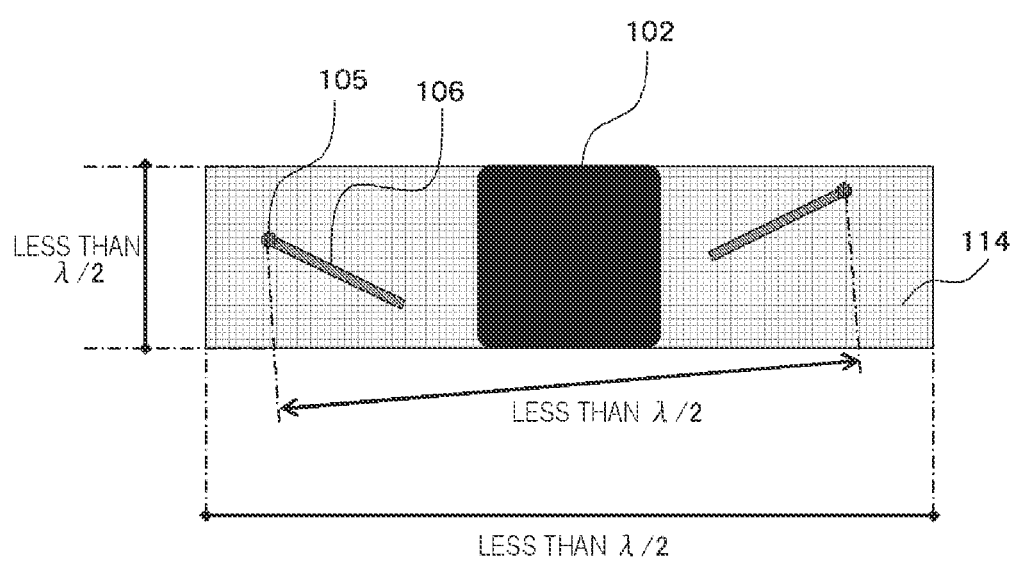
FIG. 20 is a cross-sectional view showing an example of the electronic device of the present embodiment.

FIG. 20 shows another example of the electronic device of the present embodiment. The electronic device is similarly configured to that described in FIG. 19.

The manufacturing method of the electronic device of the present embodiment may be realized similarly to the first to fourth embodiments.

According to the electronic device of the present embodiment, the following effects in addition to the effects similar to the first to fourth embodiments are realized.

According to the present embodiment, due to the unit structure having the conductor via 105 in the region (ii) 114, $\lambda/4$ resonance, in which the conductor via 105 is a short-circuited end and the end of the heat sink 103 is an open end, can be suppressed. Moreover, the positional relationship of the plurality of unit structures having the conductor via 105 in the region (ii) 114 is configured so that another conductor via 105 is disposed to be less than $\lambda/2$ from one conductor via 105, preferably, within $\lambda/4$, and thus, $\lambda/2$ resonance in which the conductor via 105 is the short-circuited end can be suppressed from being generated in the vicinity of the end of the heat sink 103.

That is, according to the present embodiment, since the resonance, which becomes a cause of radiating the electromagnetic waves having the wavelength $\lambda$, can be suppressed in the vicinity of the end of the heat sink 103, large radiation noise suppression effects can be obtained.

Moreover, the frequency of the electronic wave to obtain the radiation noise suppression effects is a design matter. However, for example, it is considered that the frequency is 2.4 GHz band, and/or 5 GHz band, or the like.

Sixth Embodiment

Hereinafter, a sixth embodiment of the present embodiment will be described with reference to the drawings. In the present embodiment, the structure of the heat sink 103 and the disposition method of the unit structures 109 are different from those of the first to fifth embodiments. Other configurations are similar to those of the first, the second, the third, the fourth, or the fifth embodiment, and here, the descriptions will not be repeated.

Figure 21:
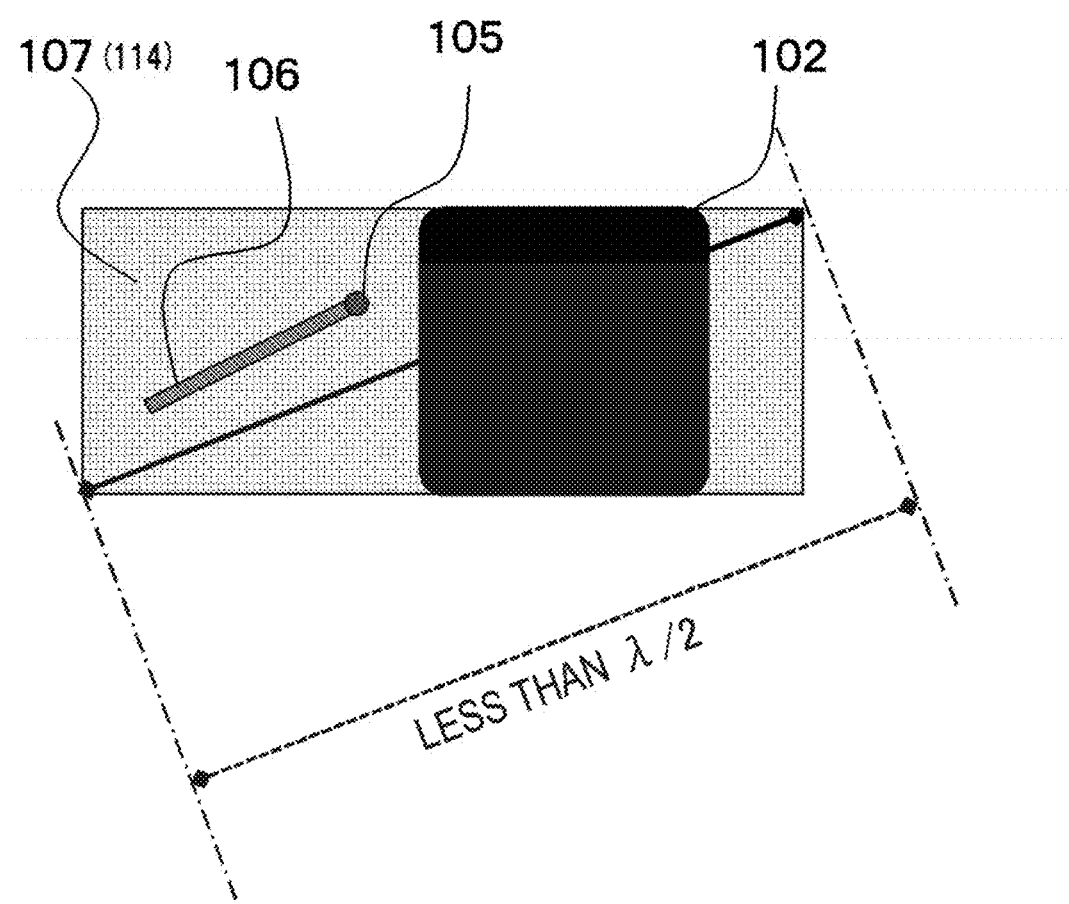
FIG. 21 is a cross-sectional view showing an example of the electronic device of the present embodiment.

FIG. 21 is a cross-sectional view of an electronic device of the present embodiment, and corresponds to FIG. 2 used in the descriptions of the first embodiment. When a wavelength with respect to the frequency of the electromagnetic wave for obtaining the radiation noise suppression effects is defined as $\lambda$, the heat sink 103 of the present embodiment includes a bottom surface in which a length of a line connecting two arbitrary points of the outer circumference on the first surface of the heat sink 103 is less than $\lambda/2$. For example, when the shape of the first surface of the heat sink 103 is a rectangle as shown in FIG. 21, the length of a diagonal line is less than $\lambda/2$. Moreover, when the shape of the first surface of the heat sink 103 is a circle, the diameter of the circle is less than $\lambda/2$.

In addition, the electronic device of the present embodiment includes only one unit structure.

The manufacturing method of the electronic device of the present embodiment may be realized similarly to the first to fifth embodiments.

According to the electronic device of the present embodiment, effects similar to the first to fifth embodiments are realized.

That is, the unit structure provided in the heat sink 103 of the present embodiment is operated to necessarily suppress the $\lambda/4$ resonance in which the conductor via 105 is the short-circuit end and the end of the heat sink 103 is the open end. Accordingly, the radiation noise suppression effects can be realized by only one unit structure.

Seventh Embodiment

Hereinafter, a seventh embodiment of the present embodiment will be described with reference to the drawings. In the present embodiment, the configuration of the unit structure 109 is different from those of the first to sixth embodiments. Other configurations are similar to those of the first, the second, the third, the fourth, the fifth, or the sixth embodiment, and the descriptions will not be repeated.

Figure 22:
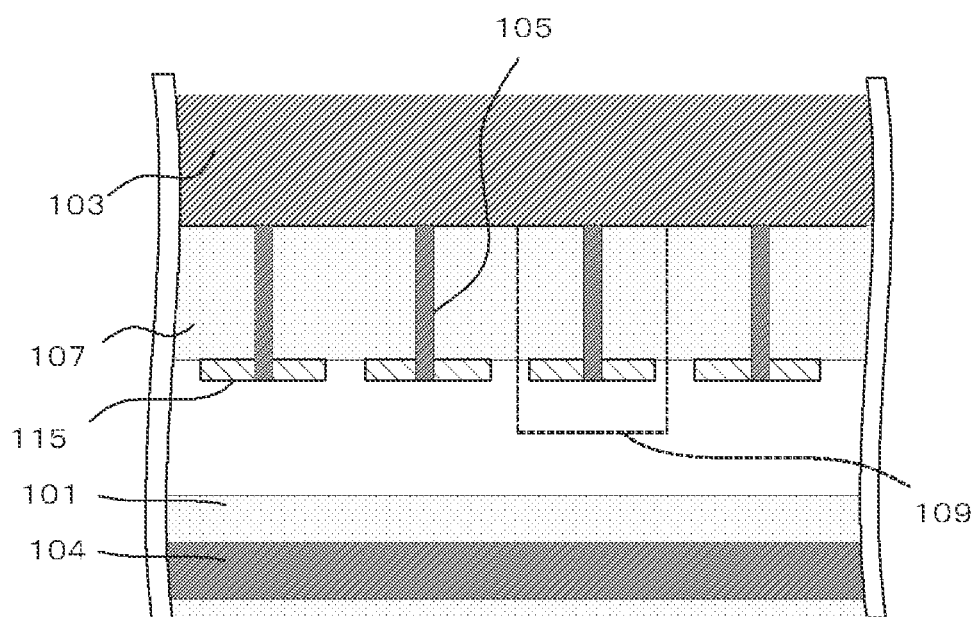
FIG. 22 is a cross-sectional view showing an example of the electronic device of the present embodiment.

FIG. 22 is a cross-sectional view of an electronic device of the present embodiment, and portions needed in the descriptions of the present embodiment are extracted and shown. The unit structure 109 of the present embodiment is different from those of the first to sixth embodiments in that an island-shaped conductor 115 is formed instead of the stub 106. Other configurations of the unit structure 109 are similar to those of the first to sixth embodiments.

The island-shaped conductor 115 is connected to the conductor via 105, and faces the conductor plane 104 and the heat sink 103. The planar shape of the island-shaped conductor 115 is not particularly limited, and may include a square, a rectangle, other quadrangles, a circle, or any one other than the above-described shapes. Moreover, a plurality of the island-shaped conductors 115 are provided, all the planar shapes may be same as one another, and other planar shapes may be mixed.

The manufacturing method of the electronic device of the present embodiment may be realized similarly to the first to sixth embodiments.

Figure 23:
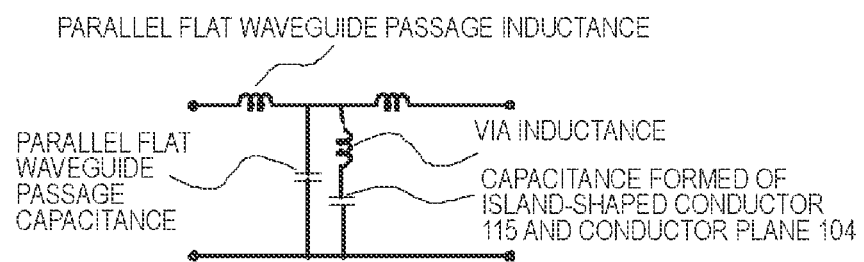
FIG. 23 is an equivalent circuit diagram of the unit structure of the present embodiment.
Figure 24:
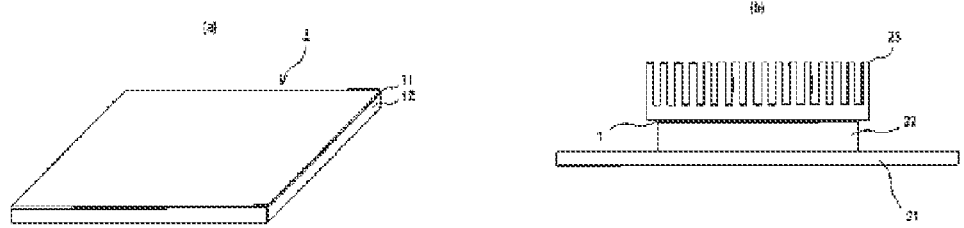
FIG. 24 is a view of an example of the related art.
Figure 25:
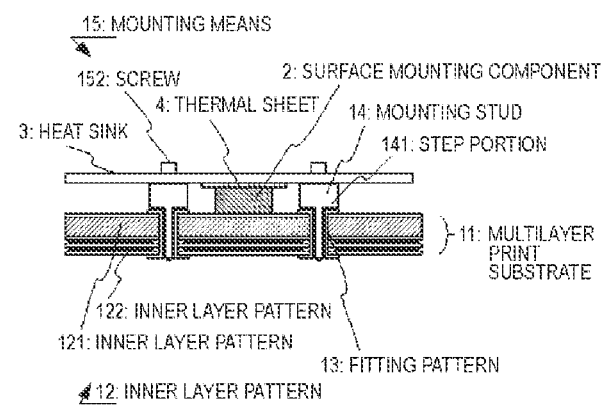
FIG. 25 is a view of an example of the related art.

According to the electronic device of the present embodiment, effects similar to those of the first to sixth embodiments are realized. Moreover, FIG. 23 shows an equivalent circuit diagram of the unit structure of the present embodiment. In the electronic device of the present embodiment, the first surface of the heat sink 103 and the conductor plane 104 provided in the substrate 101 form a parallel flat waveguide passage. Moreover, a parallel flat capacitance is formed between the island-shaped conductor 115 and the conductor plane 104. The serial impedance and the shunt admittance of the equivalent circuit are represented by the following Expressions (6) and (7), respectively.

[Expression 6]
$$Z = j\omega L_{ppw} \quad (6)$$

[Expression 7]
$$Y = j\omega C_{PPW} + \cfrac{1}{j\omega L_{via} - j\cfrac{1}{\omega C_{patch}}} \quad (7)$$

j: imaginary unit
ω: angular frequency
$L_{ppw}$: parallel flat waveguide passage inductance
$C_{ppw}$: parallel flat waveguide passage capacitance
$Z_{os}$: open stub characteristic impedance
$L_{via}$: conductor via inductance
$C_{patch}$: capacitance between island-shaped conductor and conductor plane
Z: serial impedance of transmission line
Y: shunt admittance of transmission line According to the principle discussed with reference to FIG. 9, in the frequency in which Expression (7) is inductance properties (Im[Y]<0), it is understood that the frequency band serves as the electromagnetic band gap structure. That is, according to the unit structure of the present embodiment, the frequency band serving as the electromagnetic band gap structure can be adjusted by adjusting the size of the island-shaped conductor 115 and/or the length of the conductor via 105, or the like, and thus, by adjusting $L_{via}$ and $C_{patch}$ of Expression (7).

This application claims priority based on Japanese Patent Application No. 2011-130358, filed on Jun. 10, 2011, the content of which is incorporated herein by reference.

The invention claimed is:

1. An electronic device comprising:
   a substrate;
   a conductor plane which is provided on an inner layer or a surface of the substrate;
   an electronic circuit which is mounted on the substrate;
   a heat sink which is mounted on an upper surface of the electronic circuit, includes a portion which does not overlap with the electronic circuit when seen in a plan view, faces the conductor
   plane, and is configured of a conductive material;
   a conductor via which is electrically connected to the heat sink on a surface of the heat sink contacting the electronic circuit, and extends toward but does not electrically connect to the
   conductor plane, and is located in the portion that does not overlap with the electronic circuit; and
   a stub which is connected to the conductor via and extends to be approximately parallel to the conductor plane,
   wherein a ratio h/w between a width w of the stub and a distance h between the stub and the conductor plane is less than or equal to 1, and
   wherein a plurality of stubs which extend from the single conductor via are provided.

2. The electronic device according to claim 1, further comprising:
   a dielectric layer which is formed on a heat sink surface facing the substrate except for a region contacting the electronic circuit,
   wherein the conductor via is formed in an inner portion of the dielectric layer,
   wherein the stub is formed in the inner portion or on a surface of the dielectric layer, and
   wherein a space between the substrate and the dielectric layer except for the region contacting the electronic circuit is filled with air.

3. The electronic device according to claim 2, wherein the connection between the conductor via and the heat sink is achieved through conductor foil, which is connected to the conductor via and which is formed on a substrate surface facing the heat sink, and an adhesive, by which the conductor foil and the heat sink are adhered.

4. The electronic circuit according to claim 3, wherein the adhesive is conductive.

5. The electronic device according to claim 1,
   wherein at least the lengths of the two of the plurality of the stubs, which extend from the single conductor via, are different from each other.

6. The electronic device according to claim 1,
   wherein when a wavelength of an electromagnetic wave with respect to frequency, at which radiation noise is to be suppressed, is defined as λ,
   wherein a plurality of the conductor vias are provided, and
   wherein one of the conductor vias is at a distance less than λ/4 from an outer edge portion of the heat sink when seen in a plan view, and
   another or other conductor via(s), which exist(s) at a distance less than λ/4 from the outer edge portion of the heat sink exist(s) at a distance of λ/2 from the first conductor via when seen in the plan view.

7. The electronic device according to claim 6,
   wherein the electromagnetic wave frequency, at which the radiation noise is to be suppressed, is in 2.4 GHz band and/or 5 GHz band.

8. A structure which is mounted on a region except for a region except for a region contacting an electronic circuit in a surface which contacts the electronic circuit of a heat sink mounted on an upper surface of the electronic circuit mounted on a substrate having a conductor
   plane on an inner layer or a surface, comprising:
   a conductor via which is electrically connected to the heat sink on the surface of the heat sink contacting the electronic circuit in a state of being mounted on the heat sink and extends toward but does not electrically connect to the conductor plane, and is located in a portion of the heat sink which does not overlap with the electronic circuit; and
   a stub which is connected to the conductor via, and extends to be approximately parallel to the conductor plane in a state where the heat sink is mounted on the upper surface of the electronic circuit mounted on the substrate,
   wherein a ratio h/w between a width w of the stub and a distance h between the stub and the conductor plane is less than or equal to 1, and
   wherein a plurality of stubs which extend from the single conductor via are provided.

9. The structure according to claim 8, further comprising:
   a dielectric layer which is formed on a heat sink surface facing the substrate except for a region contacting the electronic circuit,
   wherein the conductor via is provided in an inner portion of the dielectric layer,
   wherein the stub is provided in the inner portion or on a surface of the dielectric layer, and wherein a space between the substrate and the dielectric layer except for the region contacting the electronic circuit is filled with air.

10. The structure according to claim 8, wherein at least the lengths of the two of the plurality of the stubs, which extend from the single conductor via, are different from each other.

11. The structure according to claim 8, wherein in a case where a wavelength of an electromagnetic wave with respect to frequency, at which radiation noise is to be suppressed, is defined as $\lambda$, a plurality of the conductor vias are provided, and one of the conductor vias is at a distance less than $\lambda/4$ from an outer edge portion of the heat sink when seen in a plan view in a state where the heat sink is mounted, and another or other conductor via(s), which exist(s) at a distance less than $\lambda/4$ from the outer edge portion of the heat sink exist(s) within a distance of $\lambda/2$ from the first conductor via when seen in the plan view.

12. The structure according to claim 11, wherein the electromagnetic wave frequency, at which the radiation noise is to be suppressed, is in 2.4 GHz band and/or 5 GHz band.

13. A heat sink which is mounted on an upper surface of an electronic circuit mounted on a substrate having a conductor plane on an inner layer or a surface, wherein the structure according to claim 8 is mounted on a region except for a region contacting the electronic circuit in a surface contacting the electronic circuit.

\* \* \* \* \*